US008440563B2

(12) United States Patent
Matsumoto et al.

(10) Patent No.: US 8,440,563 B2
(45) Date of Patent: May 14, 2013

(54) FILM FORMING METHOD AND PROCESSING SYSTEM

(75) Inventors: Kenji Matsumoto, Nirasaki (JP); Yasushi Mizusawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 12/987,663

(22) Filed: Jan. 10, 2011

(65) Prior Publication Data
US 2011/0163451 A1 Jul. 7, 2011

Related U.S. Application Data

(63) Continuation of application No. PCT/JP2009/062380, filed on Jul. 7, 2009.

(30) Foreign Application Priority Data

Jul. 11, 2008 (JP) .................................. 2008-182062

(51) Int. Cl.
*H01L 21/44* (2006.01)

(52) U.S. Cl.
USPC ................... 438/653; 257/751; 257/E23.161; 257/E21.584; 118/696

(58) Field of Classification Search ... 438/653; 257/751, 257/E23.161, E21.584; 118/696
See application file for complete search history.

(56) References Cited

U.S. PATENT DOCUMENTS

| 6,797,068 B1 | 9/2004 | Yamasaki et al. | |
| 2005/0106882 A1* | 5/2005 | Chao et al. | 438/700 |
| 2005/0218519 A1 | 10/2005 | Koike et al. | |
| 2006/0037858 A1 | 2/2006 | Marumo et al. | |
| 2006/0169582 A1* | 8/2006 | Brown et al. | 204/298.01 |
| 2007/0048931 A1 | 3/2007 | Shimizu | |
| 2007/0069383 A1* | 3/2007 | Suzuki | 257/751 |
| 2008/0042281 A1* | 2/2008 | Abe | 257/751 |

FOREIGN PATENT DOCUMENTS

| JP | 10-229084 | 8/1998 |
| JP | 2001-53030 | 2/2001 |
| JP | 2004-107747 | 4/2004 |
| JP | 2005-277390 | 10/2005 |
| JP | 2006-80234 | 3/2006 |
| JP | 2007-67107 | 3/2007 |
| JP | 2007-141927 | 6/2007 |
| JP | 2007-220738 | 8/2007 |
| JP | 2008-31541 | 2/2008 |
| JP | 2008-47675 | 2/2008 |

OTHER PUBLICATIONS

International Search Report issued Oct. 6, 2009 in PCT/JP2009/062380 filed Jul. 7, 2009.

* cited by examiner

*Primary Examiner* — Kimberly Rizkallah
*Assistant Examiner* — Timor Karimy
(74) *Attorney, Agent, or Firm* — Rothwell, Figg, Ernst & Manbeck, P.C.

(57) ABSTRACT

Provided is a film-forming method for performing a film-forming process on a surface of a target substrate to be processed in an evacuable processing chamber, a recessed portion being formed on the surface of the target substrate. The method includes a transition metal-containing film processing process in which a transition metal-containing film is formed by a heat treatment by using a source gas containing a transition metal; and a metal film forming process in which a metal film containing an element of the group VIII of the periodic table is formed.

20 Claims, 11 Drawing Sheets

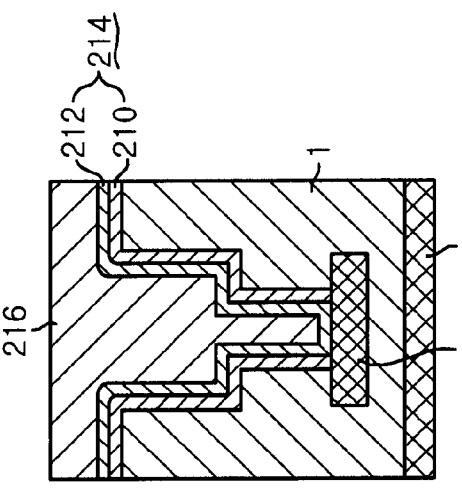
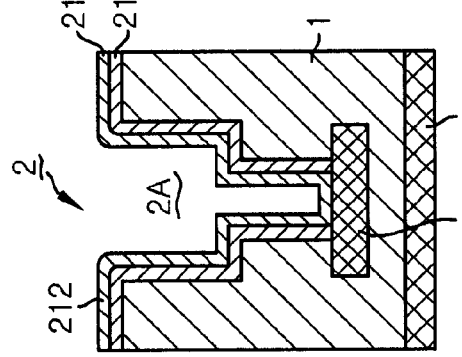
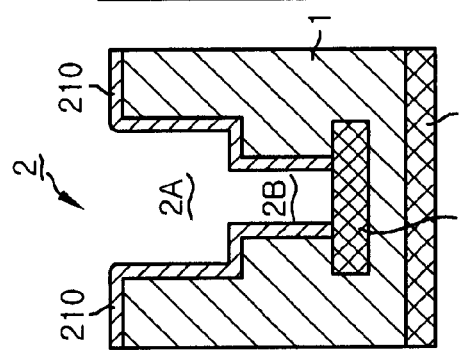
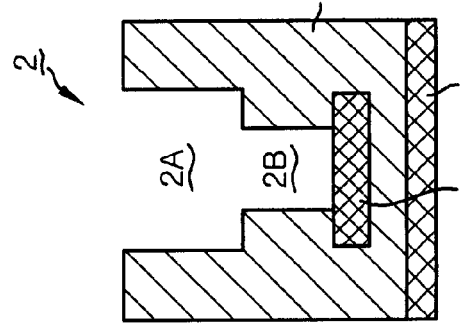

FILM FORMING METHOD AND PROCESSING SYSTEM

This application is a Continuation Application of PCT International Application No. PCT/JP2009/062380 filed on Jul. 7, 2009, which designated the United States.

FIELD OF THE INVENTION

The present invention relates to a film-forming method and a processing system, for forming, e.g., a film containing manganese and a film containing ruthenium serving as barrier layers on a surface of a target substrate, e.g., a semiconductor wafer, to be processed.

BACKGROUND OF THE INVENTION

In general, processes such as a film-forming process and a pattern etching process are repeatedly performed to manufacture semiconductor devices. In this regard, the line width and hole diameter become gradually reduced in response to the demand for higher integration and higher miniaturization of the semiconductor devices. Since it is required to reduce the electric resistance further due to the scaling-down of various dimensions, an inexpensive copper having a small electric resistance tends to be used as a wiring material or a filling material for filling a recessed portion such as a trench, a hole or the like (see, e.g., Japanese Patent Application Publication No. 2004-107747). As such, in case that the copper is used as a wiring material or a filling material, a tantalum (Ta) film, a tantalum nitride (TaN) film or the like is typically used as a barrier layer in consideration of its barrier property against the diffusion of copper to an underlying layer thereof.

In order to fill a recessed portion with the copper, a thin seeding film formed of a copper film is first formed on the entire surface of a wafer including the entire wall surface of the recessed portion. Then, the recessed portion is completely filled by plating the entire surface of the wafer with the copper. Thereafter, remnants of the copper thin film are removed from the surface of the wafer by a chemical mechanical polishing (CMP).

Such a process will be described with reference to FIGS. 14A to 14C. FIGS. 14A to 14C are views for explaining a conventional filling process on a recessed portion of a semiconductor wafer.

A recessed portion 2, e.g., a through hole, a groove (trench), a via hole for forming a dual damascene pattern, or the like, is formed on a surface of an insulation layer 1, e.g., an interlayer dielectric film, formed on a semiconductor wafer W. On the bottom of the recessed portion 2, a lower wiring layer 3 formed of, e.g., a copper is formed to be exposed.

Specifically, the recessed portion 2 includes an elongated groove (trench) 2A having a concave section; and a hole 2B formed at a part of the bottom portion of the recessed portion 2. The hole 2B becomes a contact hole or a through hole. The wiring layer 3 is exposed on the bottom of the hole 2B to make an electric connection to a lower wiring layer (not shown), a transistor (not shown) and/or the like.

The insulation layer 1 is formed of, e.g., a film mainly containing $SiO_2$. In response to the scaling-down of the design rule, the width of the recessed portion 2 is formed to be very small, e.g., about 120 nm, and the aspect ratio thereof is set to range from, e.g., about 2 to 4. The shape shown in FIGS. 14A to 14c is simplified by omitting the illustration of a diffusion barrier film, an etching stop film and the like.

On the surface of the semiconductor wafer W including the inner surface of the recessed portion 2, a barrier layer 4 made of, e.g., a TaN film and a Ta film is substantially uniformly pre-formed by using a plasma sputter device (see FIG. 14A). Then, by the plasma sputter device, a seeding film 6 formed of a thin metal film, e.g., a copper film, is formed over the entire surface of the wafer including the inner surface of the recessed portion 2 (see FIG. 14B). When the seeding film 6 is formed in the plasma sputter device, an RF bias power is supplied to the semiconductor wafer and, thus, the attraction of copper ions thereto is efficiently performed. Further, by performing a copper plating process on the surface of the wafer, the inside of the recessed portion 2 is filled with a metal film 8 formed of, e.g., a copper film (see FIG. 14C). Thereafter, remnants of the metal film 8, the seeding film 6 and the barrier layer 4 are polished by the CMP or the like to be removed.

Recently, various developments have been made to further improve the reliability of the barrier layer. Especially, the attention is given to a self-forming barrier layer using a manganese (Mn) film or the like instead of the Ta film or the TaN film (see, e.g., Japanese Patent Applications Publication Nos. 2005-277390 and 2007-067107). The Mn film is formed by the sputtering, and the Mn film itself serves as a seeding film. Accordingly, a Cu plating layer is directly formed thereon.

By performing an annealing process after the plating, the Mn film reacts with a $SiO_2$ film serving as the lower insulation film by self-alignment, so that an Mn barrier film such as $MnSi_xO_y$ film (x and y being positive numbers (the same hereinafter)) or a manganese oxide $MnO_x$ (x being a positive number) at a boundary portion of the $SiO_2$ film and the Mn film. In this way, it is possible to reduce the number of the manufacturing processes.

In this regard, in the case of a thin Mn film, an entire part of the film is formed of $MnO_x$ or $MnSi_xO_y$. Further, the manganese oxide includes MnO, $Mn_3O_4$, $MnO_2$ and the like depending on the valency of the Mn, which are generally referred to as "$MnO_x$."

In the meantime, the Mn barrier film has a relatively good barrier property against the Cu film, while the Cu film formed on the Mn film or the Mn barrier film has a relatively poor wetting property (wettability). As a result, since the adhesivity of the Cu film formed on the Mn film or the Mn barrier film becomes poor, the adhesive inferiority may occur between the Cu film and the Mn film or the Mn barrier film.

SUMMARY OF THE INVENTION

In view of the above, the present invention provides a film-forming method and a processing system, for forming a layer structure capable of having a good barrier property against, e.g., a Cu film and a good adhesivity to, e.g., the Cu film thereon.

In accordance with an aspect of the present invention, there is provided a film-forming method for performing a film-forming process on a surface of a target substrate to be processed in an evacuable processing chamber, a recessed portion being formed on the surface of the target substrate. The method includes a transition metal containing-film forming process in which a transition metal containing-film is formed by a heat treatment by using a source gas containing a transition metal; and a metal film forming process in which a metal film containing an element of the group VIII of the periodic table is formed.

With such configuration, it is possible to obtain a stacked structure of the transition metal-containing film and the metal film containing the element of the group ME and, thus, it is possible to realize an excellent barrier property and adhesivity with regard to a Cu film to be formed on the stacked structure.

Preferably, the heat treatment is a chemical vapor deposition (CVD). In this case, for example, the heat treatment is a thermal CVD using the source gas and a reducing gas.

Preferably, a heat treatment is performed in the metal film forming process. In this case, the heat treatment in the metal film forming process is a CVD.

Preferably, the transition metal-containing film forming process and the metal film forming process are successively performed in a same processing chamber, and a mixed layer containing the transition metal and the element of the group VIII is formed by gradually increasing a supply amount of a VIII-group source gas including an element of the group VIII while gradually reducing a supply amount of the transition metal-containing source gas during a transition from the transition metal-containing film forming process to the metal film forming process.

For example, the metal film is formed by a sputtering method in the metal film forming process.

Preferably, a filling process in which the recessed portion is filled by depositing a copper film is performed after the metal film forming process. In this case, the filling process is performed by using a CVD, for example. Alternatively, the filling process is performed by applying a plating method, for example. Further alternatively, the filling process is performed by employing a sputtering method, for example.

Preferably, an annealing process in which the target substrate is annealed is performed after the filling process.

Preferably, a base (underlying) film of the transition metal containing film is formed of at least one film selected from a group consisting of a $SiO_2$ film, a SiOF film, a SiC film, a SiN film, a SiOC film, a SiCOH film, a SiCN film, a porous silica film, a porous methylsilsesquioxane film, a polyarylene film, a SILK (trademark) film and a fluorocarbon film.

Preferably, a wiring layer is formed at a lower portion of the recessed portion.

Preferably, the transition metal-containing source gas includes an organic metal material gas or a metal complex material gas.

Preferably, the transition metal includes manganese (Mn), and an organic metal material includes at least one material selected from a group consisting of $Cp_2Mn$ [$=Mn(C_5H_5)_2$], $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)$ $(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2$ [$=Mn$ $(C_5HF_6O_2)_3$], and $((CH_3)_5Cp)_2Mn[=Mn((CH_3)_5C_5H_4)_2]$.

Preferably, a plasma is also used in each of the heat treatments.

Preferably, the element of the group VIII includes at least one element selected from a group consisting of Fe, Co, Ni, Ru, Rh, Pd, Os, Ir and Pt.

In accordance with another aspect of the present invention, there is provided a processing system for processing a target substrate. The system includes a first processing apparatus for forming a transition metal-containing film by a heat treatment by using a source gas containing a transition metal on a surface of the target substrate; a second processing apparatus for forming a metal film containing an element of the group VIII of the periodic table on the surface of the target substrate; a third processing apparatus for forming a copper film on the surface of the target substrate; a common transfer chamber connected to each of the processing apparatuses; a transfer mechanism, provided in the common chamber, for transferring the target substrate to each of the processing apparatuses; and a system control unit for controlling the processing system to perform the film-forming method having one of the above features.

In accordance with still another aspect of the present invention, there is provided a processing system for processing a target substrate. The system includes a first processing apparatus for forming a transition metal-containing film by a heat treatment by using a source gas containing a transition metal on a surface of the target substrate and a metal film containing an element of the group VIII of the periodic table on the surface of the target substrate; a second processing apparatus for forming a copper film on the surface of the target substrate; a common transfer chamber connected to each of the processing apparatuses; a transfer mechanism, provided in the common chamber, for transferring the target substrate to each of the processing apparatuses; and a system control unit for controlling the processing system to perform the film-forming method having one of the above features.

In accordance with still another aspect of the present invention, there is provided a computer-readable storage medium storing a computer-readable program for controlling one of the processing systems to perform a film-forming method having one of the above features.

In accordance with still another aspect of the present invention, there is provided a semiconductor device having a film structure formed by a film-forming method having one of the above features.

In accordance with still another aspect of the present invention, there is provided an electronic apparatus having a film structure formed by a film-forming method having one of the above features.

BRIEF DESCRIPTION OF THE DRAWINGS

FIGS. 6A to 6D show an example of a deposition process of a thin film based on a recessed portion of a semiconductor wafer;

DETAILED DESCRIPTION OF THE EMBODIMENTS

Embodiments of a film-forming method and a processing system in accordance with the present invention will now be described with reference to the accompanying drawings which form a part hereof.

(Processing System)

Figure 1:
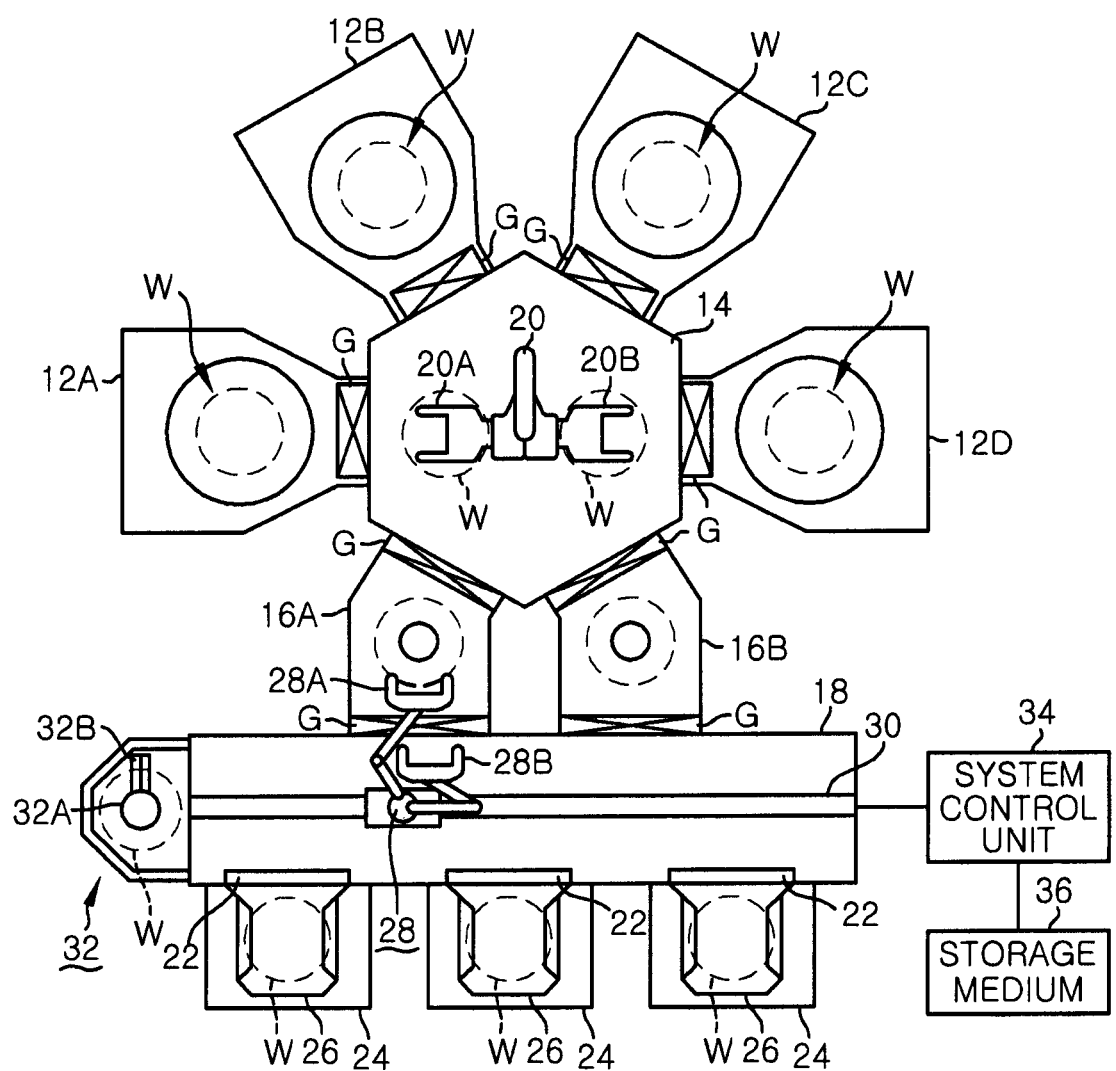
FIG. 1 is a schematic view showing a processing system in accordance with a first embodiment of the present invention.
Figure 2:
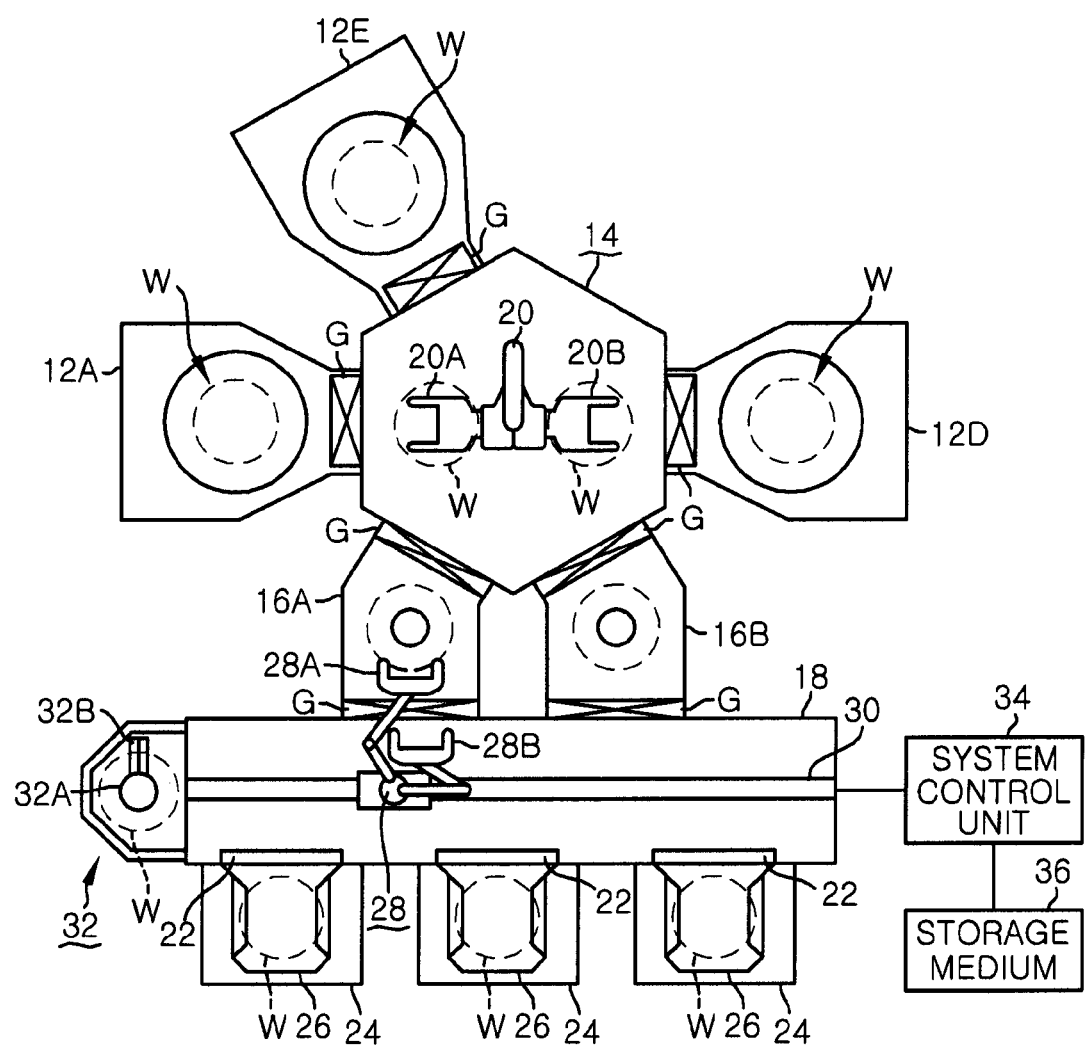
FIG. 2 is a schematic view showing a processing system in accordance with a second embodiment of the present invention.

First, a processing system for performing the film-forming method of the present invention will be described. FIGS. 1 and 2 are schematic views respectively showing processing systems in accordance with a first and a second embodiment of the present invention.

Hereinafter, the first embodiment will be described. As shown in FIG. 1, a processing system 10 mainly includes a plurality of, e.g., four processing apparatuses 12A to 12D; an approximately hexagonal common transfer chamber 14; a first and a second load-lock chamber 16A and 16B having a load-lock function; and an inlet side transfer chamber 18 extended longitudinally.

In this embodiment, one (e.g., the processing apparatus 12A) of the four processing apparatuses 12A to 12D serves to perform a pre-treatment on a target substrate, e.g., a semiconductor wafer W, to be processed. Another one (e.g., the processing apparatus 12B) of the four processing apparatuses 12A to 12D serves to form a film containing a transition metal on the semiconductor wafer W. Still another one (e.g., the processing apparatus 12C) of the four processing apparatuses 12A to 12D serves to form a metal film containing an element of the group VIII of the periodic table on the semiconductor wafer W. The other one (e.g., the processing apparatus 12D) of the four processing apparatuses 12A to 12D serves to deposit a copper film on the semiconductor wafer W.

A typical cleaning-process apparatus and a thermal film forming apparatus for performing the thermal chemical vapor deposition (CVD) or the like are respectively used as the first and the fourth processing apparatus 12A and 12D. However, it is not necessary for the processing system 10 to include the first and the fourth processing apparatus 12A and 12D. In other words, respective processes corresponding to the functions of the first and the fourth processing apparatus 12A and 12D may be performed by apparatuses other than the apparatuses 12A and 12D.

In the example shown in FIG. 1, the processing apparatuses 12A to 12D are respectively connected to four sides of the approximately hexagonal common transfer chamber 14, and the first and the second load-lock chamber 16A and 16B are respectively connected to the remaining sides thereof. Further, the first and the second load-lock chamber 16A and 16B are commonly connected to the inlet side transfer chamber 18.

The common transfer chamber 14 is airtightly connected to the respective processing apparatuses 12A to 12D and the first and the second load-lock chamber 16A and 16B via openable gate valves G, which constitutes a cluster tool. The gate valves G respectively serve to allow the processing chambers 12A to 12D and the first and the second load-lock chamber 16A and 16B to communicate with the common transfer chamber 14 as necessary. In the meantime, the common transfer chamber 14 is in a vacuum level.

In addition, openable gate valves G are airtightly provided between the inlet side transfer chamber 18 and the first and the second load-lock chamber 16A and 16B. The first and the second load-lock chamber 16A and 16B are repeatedly changed between a vacuum state and an atmospheric state in accordance with the loading and the unloading of the wafers.

In the common transfer chamber 14, a transfer mechanism 20 including a multi-joint arm that is contractible, extendible and rotatable is provided at a position where the multi-joint arm can have access to the two load-lock chambers 16A and 16B and the four processing apparatuses 12A to 12D. The multi-joint arm has two picks 20A and 20B that are independently contractible and extendible in the mutually opposite directions, coping with two wafers at a time. Alternatively, the transfer mechanism 20 may include a multi-joint arm with one pick.

The inlet side transfer chamber 18 has a horizontally extending box shape. One or more (e.g., three in FIG. 1) loading openings for introducing the target substrate, e.g., a semiconductor wafer, to be processed are formed one side (longitudinal side) of the horizontally extending box shaped transfer chamber 18. Opening/closing doors 22 are respectively provided in the loading openings. Further, inlet ports 24 are respectively provided to correspond to the loading openings, on each of which a cassette container 26 can be mounted. Each of the cassette containers 26 can accommodate a plurality of, e.g., 25, wafers W by respectively mounting the wafers W on a plurality of stepped portions provided therein with an equal pitch. The cassette containers 26 are in, e.g., a sealed state and filled with a nonreactive gas atmosphere including $N_2$ gas or the like.

Provided in the inlet side transfer chamber 18 is an inlet side transfer mechanism 28 for transferring the wafer W along the longitudinal direction. The inlet side transfer mechanism 28 has two picks 28A and 28B that are independently contractible and extendible, coping with two wafers at a time. In the inlet side transfer chamber 18, the inlet side transfer mechanism 28 is slidably supported on a guide rail 30 provided to be extended in the longitudinal direction.

An orientor 32 for performing the wafer alignment is provided at one end of the inlet side transfer chamber 18. The orientor 32 includes a rotatable table 32A that is rotated by a driving motor. The rotatable table 32A with the wafer W mounted thereon is rotated. An optical sensor 32B is provided around the rotatable table 32A to monitor the peripheral edge of the wafer W. Accordingly, the orientor 32 performs the alignment of the wafer W by detecting an orientation of a position determination cutout, e.g., notch or orientation flat, and a misalignment of the center of the wafer W.

The processing system 10 includes a system controller 34 including, e.g., a computer to control general operations of the system. A program required to control the general operations is stored in a storage medium 36 such as a flexible disc, a compact disc (CD), a hard disc, a flash memory or the like. By program-based commands from the system controller 34, respective controls of the start or stop of the gas supply, the flow rate, process temperature (temperature of wafer), process pressure (pressure inside processing chamber), the transfer of the wafers and the like are performed.

Figure 14A:
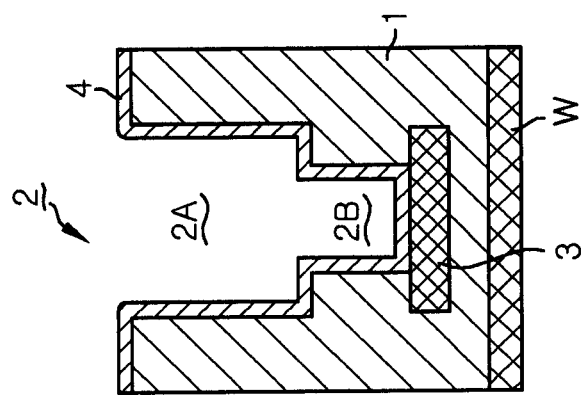
FIGS. 14A to 14C are views for explaining a conventional filling process of a recessed portion of a semiconductor wafer.
Figure 14B:
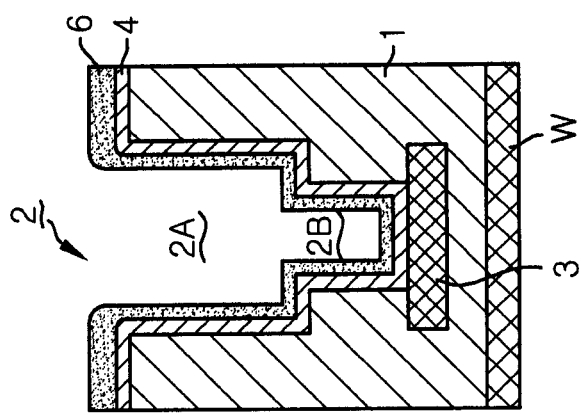
Figure 14C:
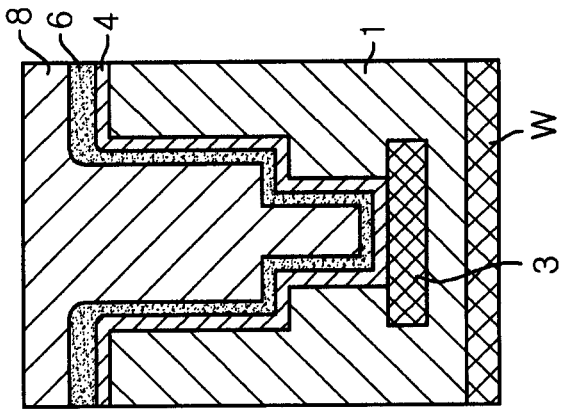

A schematic operation of the processing system 10 having such configuration will be described. First, a target semiconductor wafer W to be processed is accommodated into the inlet side transfer chamber 18 from the cassette container 26 installed in the inlet port 24 by the inlet side transfer mechanism 28. The accommodated wafer W is transferred to the orientor 32 provided at one end of the inlet side transfer chamber 18 to be subjected to a positioning process. The wafer W is formed of, e.g., a silicon substrate, and the recessed portion 2 (see FIG. 14) is pre-formed on a surface of the wafer W.

The wafer W that has been subjected to the positioning process is re-transferred to one of the first and the second load-lock chamber 16A and 16B by the inlet side transfer mechanism 28. The inside of the corresponding load-lock chamber 16A or 16B is evacuated to a vacuum level and, then, the wafer W in the vacuum load-lock chamber 16A or 16B is accommodated into the common transfer chamber 14 by the transfer mechanism 20 of the common transfer chamber 14 that has already been evacuated to the vacuum level.

The target wafer W accommodated in the common transfer chamber 14 is first loaded into the first processing apparatus 12A. In the processing apparatus 12A, the pre-treatment is performed on the wafer W. The pre-treatment includes a general degas process and/or a cleaning process on the recessed portion 2 provided on the surface of the wafer W. As the cleaning process, a $H_2$ plasma process, an Ar plasma process, a dry cleaning process using organic acid, a cleaning process using hot-wire atomic hydrogen or the like is carried out.

After the pre-treatment is completed, the wafer W is loaded into the second processing apparatus 12B. In the second processing apparatus 12B, a transition metal-containing film forming process is performed to form a film containing a transition metal on the surface of the wafer W. As will be described later, in the transition metal-containing film forming process, the film-formation is carried out by performing a heat treatment such as a thermal CVD or the like by use of a source gas containing a transition metal. In the present embodiment, Mn is used as the transition metal, and a $MnO_x$ film serving as a transition metal-containing film (Mn containing film) is formed.

After the transition metal-containing film forming process is completed, the wafer W is loaded into the third processing apparatus 12C. In the third processing apparatus 12C, a metal film forming process is performed to form, on the surface of the wafer W, a metal film containing an element of the group VIII of the periodic table. In the present embodiment, as will be described later, by using, e.g., ruthenium (Ru), a Ru film serving as a metal film is formed. As such, a barrier layer against a Cu film is formed in a layer structure of the $MnO_x$ film and the Ru film.

After the metal film forming process is completed, the wafer W is loaded into the fourth processing apparatus 12D. In the fourth processing apparatus 12D, a filling process is performed to fill the inside of the recessed portion 2 by depositing a copper film on the surface of the wafer W. If the filling process is completed, the processes are completed in the processing system 10.

The processed wafer W is transferred, via one of the load-lock chamber 16A and 16B and the inlet side transfer chamber 18, into the cassette container 26 of the inlet port 24 for the processed wafers to be stored therein.

Moreover, the inside of the common transfer chamber 14 is changed from the atmosphere of a rare gas such as Ar, He or the like or a nonreactive gas such as dry $N_2$ or the like to a depressurized state.

In the processing system of the first embodiment, the second and the third processing apparatus 12B and 12C are separately provided and the transition metal-containing film forming process and the metal film forming process respectively are performed by different apparatuses. Alternatively, the two processes may be performed by one apparatus in accordance with a second embodiment, which is shown in FIG. 2. In FIG. 2, components having substantially the same configurations and functions as those in FIG. 1 are denoted by like reference characters and, thus, redundant description thereof will be omitted herein.

The processing system of the second embodiment, as shown in FIG. 2, includes a fifth processing apparatus 12E replacing the second processing apparatus 12B shown in FIG. 1 while the third processing apparatus 12C (see FIG. 1) is removed. As will be described later, in the fifth processing apparatus 12E, the transition metal-containing film, e.g., a $MnO_x$ film, and the metal film, e.g., a Ru film are successively formed. In this case, since one apparatus is removed, the equipment cost may be reduced by as much as that of the removed apparatus. Alternatively, another fourth processing apparatus 12D may be additionally provided at a position where the third processing system 12C has been removed to improve the throughput.

(Description Related to Second Processing Apparatus 12B)

Figure 3:
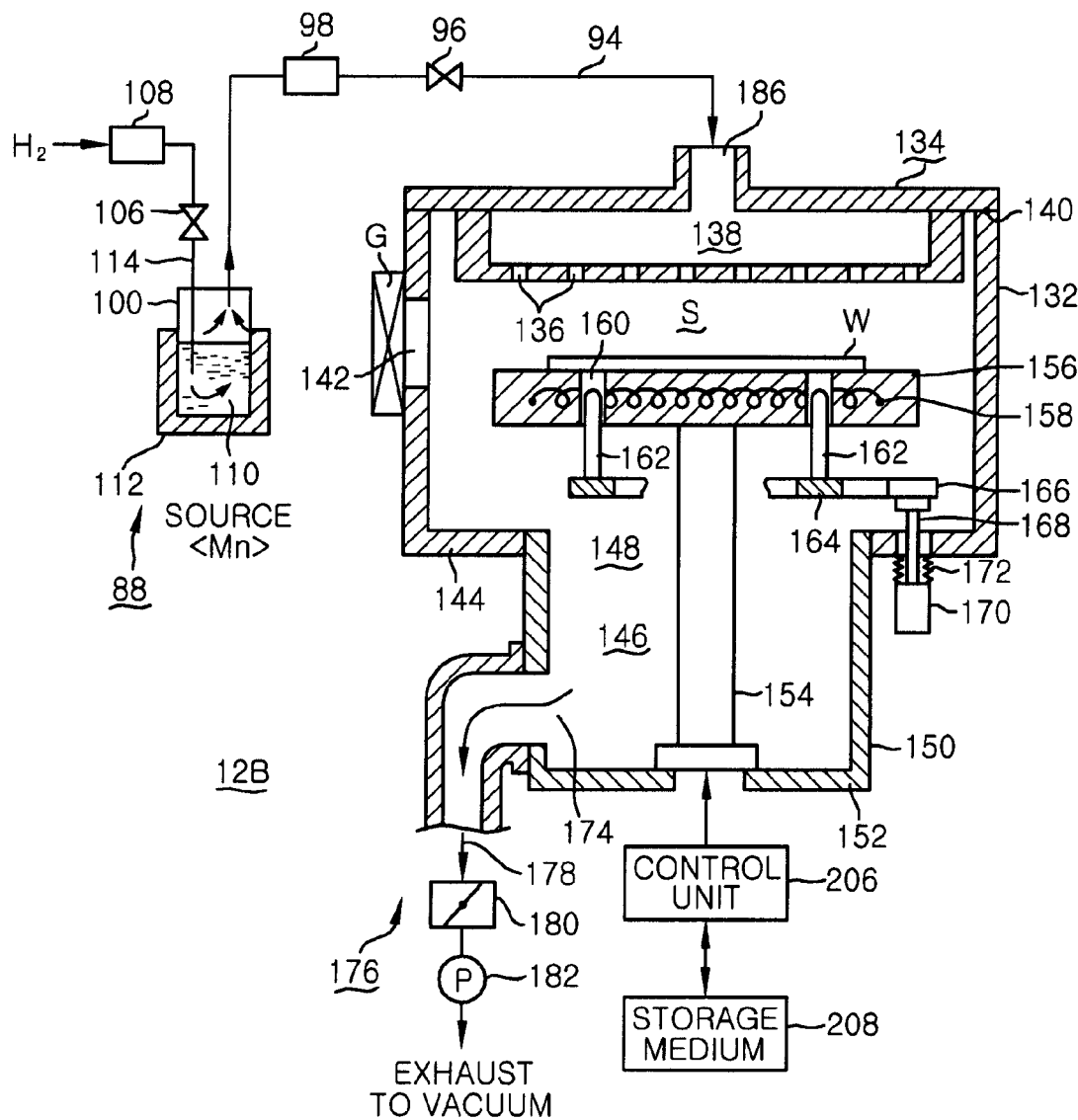
FIG. 3 shows an example of a second processing device.

Since the first processing apparatus 12A is a typical cleaning process apparatus as described above, corresponding description will be omitted, and the second processing apparatus 12B will be described. FIG. 3 is a configuration view showing an example of the second processing apparatus 12B. The second processing apparatus 12B is an apparatus for forming a transition metal-containing film on the surface of the wafer by the heat treatment by using a source gas containing a transition metal. In the present embodiment, the case of forming a $MnO_x$ film (x being a positive number) serving as the transition metal-containing film is taken as an example.

The second processing apparatus 12B includes a processing chamber 132 formed of aluminum, the inside of which has, e.g., an approximately cylindrical shape. Moreover, a shower head 134 is provided at a ceiling portion of the processing chamber 132, the shower head 134 serving as a gas introducing unit for introducing a necessary processing gas, e.g., a film-formation gas. A processing gas is injected to a processing space S through a plurality of gas injection holes 136 provided on a lower gas injection surface of the shower head 134.

A hollow gas diffusion space 138 is provided in the shower head 134 such that a processing gas introduced to the gas diffusion space 138 is diffused in a plan direction and then ejected through the gas injection holes 136 that communicates therewith. The whole part of the shower head 134 is formed of, e.g., nickel, a nickel alloy such as Hastelloy (trademark), aluminum or an aluminum alloy. A sealing member 140 formed of, e.g., an O ring is provided at a connection portion between the shower head 134 and an upper opening of the processing chamber 132. The sealing member 140 serves to maintain the airtightness of the processing chamber 132.

Provided on a sidewall of the processing chamber 132 is a loading/unloading port 142 through which the semiconductor wafer W as a target substrate to be processed is loaded into and unloaded from the processing chamber 132. An openable gate valve G is airtightly provided in the loading/unloading port 142.

A gas exhaust space 146 is formed at a bottom portion 144 of the processing chamber 132. Specifically, a large opening 148 is formed at a central portion of the bottom portion 144, and a cylindrical wall 150 having a bottom is connected to the opening 148 and extended downwardly. The gas exhaust space 146 is defined in the cylindrical wall 150. Moreover, a cylinder-shaped support column 154 is uprightly installed at a bottom portion 152 of the cylindrical wall 150, and a mounting table 156 for mounting thereon the semiconductor wafer W is provided at an upper end of the support column 154.

The mounting table 156 is formed of, e.g., a ceramic material or a quartz glass. In the mounting table 156, a resistance heater 158 serving as a heating unit is accommodated. The resistance heater 158 is formed of, e.g., a carbon wire heater or the like for generating heat by electric connection. Accordingly, the semiconductor wafer W mounted on the upper surface of the mounting table 156 can be heated by the resistance heater 158.

In the mounting table 156, a plurality of, e.g., three, pin insertion holes 160 are formed to be vertically extended therethrough (only two pin insertion holes 160 are shown in FIG. 3). Upthrust pins 162 are respectively loosely inserted into the pin insertion holes 160. A circular ring-shaped upthrust ring 164 formed of, e.g., a ceramic material such as alumina is arranged at lower ends of the upthrust pins 162. By the upthrust ring 164, the lower ends of the upthrust pins 162 are supported. An arm unit 166 extended from the upthrust ring 164 is connected to an up/down rod 168 provided to be extended through the bottom portion 144 of the processing chamber 132, and the up/down rod 168 is vertically movable by an actuator 170. Accordingly, when receiving and transferring a wafer W, the upthrust pins 162 are respectively moved up and down from the upper ends of pin insertion holes 160.

Moreover, an extensible and contractible bellows is provided at a portion of the bottom portion 144 through which the up/down rod 168 of the actuator 170 is extended, so that the up/down rod 168 can be vertically movable while maintaining airtightness in the processing chamber 132.

The inlet side opening 148 of the gas exhaust space 146 is formed to have a smaller diameter than that of the mounting table 156, and a gas flowing downward beyond an outer circumferential edge portion of the mounting table 156 travels below the mounting table 156 into the opening 148. At a lower sidewall of the cylindrical wall 150, a gas exhaust port 174 is formed to be open toward the gas exhaust space 146. A vacuum exhaust system 176 is connected to the gas exhaust port 174.

The vacuum exhaust system 176 includes a gas exhaust path 178 connected to the gas exhaust port 174, and a pressure control valve 180, a vacuum pump 182, a scrubber and the like are successively provided in the gas exhaust path 178. Accordingly, the vacuum exhaust system 176 can evacuate the atmosphere in the processing chamber 132 and the gas exhaust space 146 to a vacuum level while controlling the pressure therein.

A source gas supply system 88 is connected to the shower head 134, the source gas supply system 88 serving to supply a source gas containing a transition metal. Specifically, the source gas supply system 88 for supplying the source gas containing a transition metal includes a source gas line 94 connected to a gas inlet 186 of the gas diffusion chamber 138.

In the source gas line 94, an on-off valve 96 and a mass flow controller 98 are successively provided. The source gas line 94 is connected to a first source tank 100 for storing the source gas containing a transition metal.

Inserted into the first source tank 100 is a bubbling gas line 114, a leading end of which is positioned around a bottom portion of the first source tank 100. In the bubbling gas line 114, a mass flow controller 108 and an on-off valve 106 are successively provided. Accordingly, a source 110 is preferably converted to a gas by introducing a bubbling gas into the first source tank 100 while controlling the flow rate thereof. Then, the source gas thus generated is supplied along with the bubbling gas.

In the present embodiment, a reducing gas, e.g., $H_2$ gas, is used as the bubbling gas. Moreover, in the first source tank 100, a tank heating unit 112 for heating the source 110 is provided to improve the vaporization. In the present embodiment, for example, $(EtCp)_2Mn$ (precursor) serving as a liquid source containing manganese is used as the source 110.

As the bubbling gas, a reduction nonreactive gas, e.g., $N_2$ gas or a rare gas such as He gas, Ne gas, Ar gas or the like may be used instead of $H_2$ gas. Further, in order to prevent the source gas from being re-condensed on the source gas line 94, and the on-off valve 96 and the mass flow controller 98 provided therein, a tape heater, an aluminum block heater, a mantle heater, a silicon lever heater or the like, which are not shown, is wound on the source gas line 64, the on-off value 96 and the mass flow controller 98 to heat them.

A purge gas supply unit (not shown) is connected to the shower head 134 to supply a purge gas as necessary. As the purge gas, a nonreactive gas such as $N_2$ gas, Ar gas, He gas, Ne gas or the like; or a reducing gas such as $H_2$ gas or the like may be used.

In addition, a control unit 206 including, e.g., a computer or the like is provided to control general operations of the apparatus. Accordingly, the controls of the start or stop of the gas supply, the gas supply rate, the pressure inside the processing chamber 40, the temperature of the wafer W, and the like are performed. The control unit 206 includes a storage medium 208 for storing a computer program for performing the above controls. As the storage medium 208, e.g., a flexible disc, a flash memory, a hard disc, a compact disc or the like may be used. Further, the control unit 206 is operated under the control of the system control unit 34 (see FIG. 1).

Next, the operation of the second processing system 12B having such configuration will be described. First, the semiconductor wafer W is held and transferred by the transfer mechanism 20 (see FIG. 1) and is loaded into the processing chamber 132 via the opened gate valve G and the loading/unloading port 142. The wafer W is transferred onto the upwardly moved upthrust pins 162 and then mounted and supported on the upper surface of the mounting table 156 as the upthrust pins 162 are moved downwardly.

Thereafter, the source gas supply system 88 for supplying a source gas containing a transition metal is operated and a film-formation gas is supplied to the shower head 134 at a controlled flow rate. Then, the film-formation gas is introduced into the processing space S by being injected through the gas injection holes 136.

The atmospheres in the processing chamber 132 and the gas exhaust space 146 are evacuated to a vacuum level by continuously driving the vacuum pump 182 provided in the vacuum exhaust system 176. In addition, the atmosphere in the processing space S is maintained to a predetermined process pressure by adjusting the valve opening level of the pressure control valve 180. At this time, the wafer W is heated by the resistance heater 158 provided in the mounting table 156 to be maintained at a predetermined process temperature. Accordingly, a desired transition metal-containing film, i.e., a $MnO_x$ film in the present embodiment, is formed on the surface of the semiconductor wafer W.

(Description Related to Third Processing Apparatus 12C)

Figure 4:
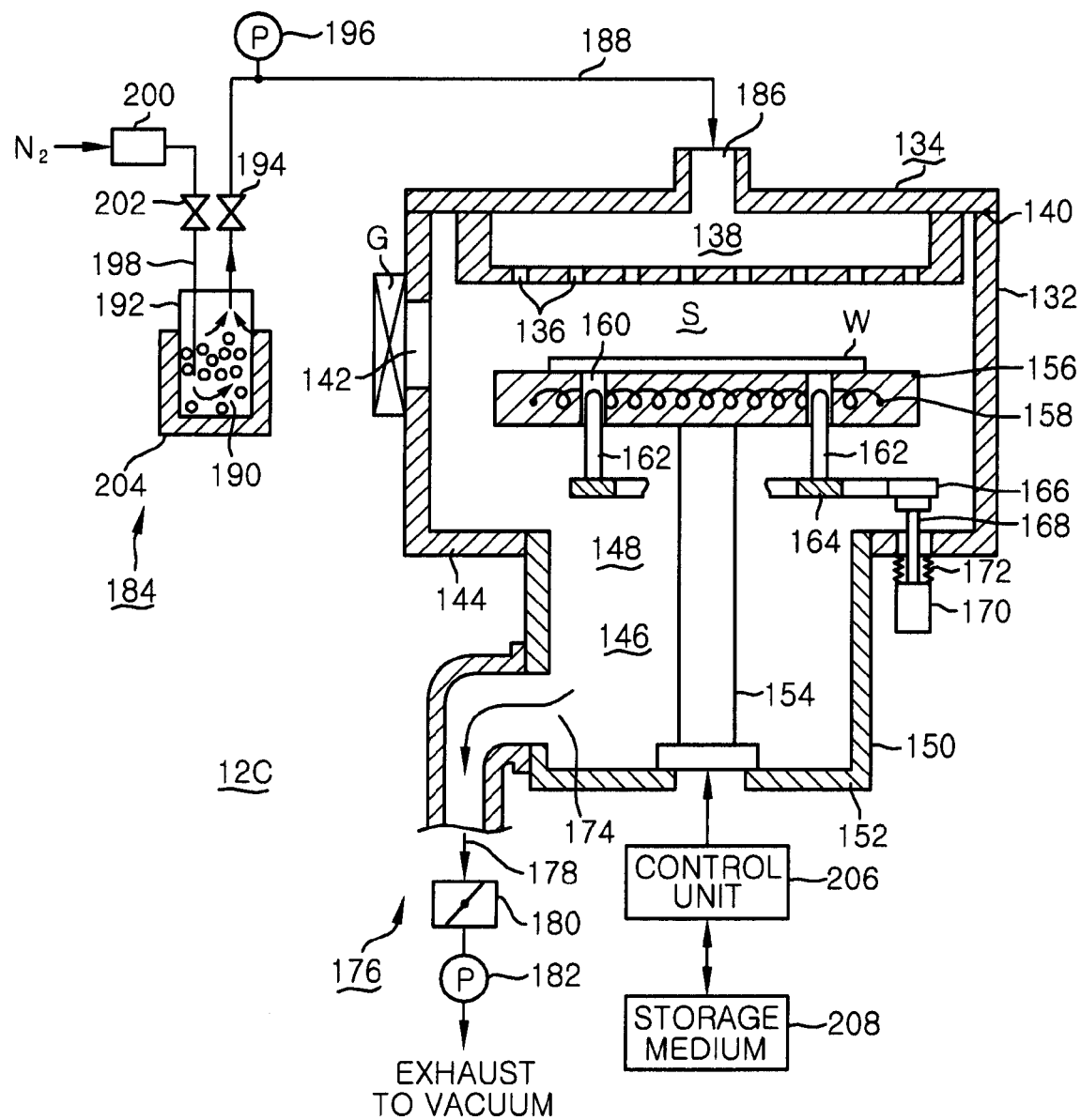
FIG. 4 shows an example of a third processing device.

Next, the third processing apparatus 12C will be described. Since the fourth processing apparatus 12D is a typical thermal film-forming processing apparatus as described above, description thereof will be omitted. FIG. 4 is a configuration view showing an example of the third processing apparatus 12C. The third processing apparatus 12C is an apparatus for forming, on the surface of the wafer W, a metal film containing an element of the group VIII of the periodic table. In the present embodiment, the case of forming a Ru film serving as a metal film is described as an example.

The third processing apparatus 12C has an approximately same configuration as that of the second processing apparatus 12B except for the source gas supply system.

A source gas supply system 184 is connected to the shower head 134, the source gas supply system 184 serving to supply a source gas of a metal film. Specifically, the source gas supply system 184 for supplying the source gas of a metal film includes a source gas line 188 connected to a gas inlet 186 of the gas diffusion chamber 138.

The other end of the source gas line 188 is connected to a second source tank 192 for storing a solid source 190. In the source gas line 188, an on-off valve 194 and a pressure gauge 196 for gauging the pressure inside the source gas line 188 are provided. As the pressure gauge 196, e.g., a capacitance manometer may be used. In the present embodiment, the vapor pressure of the source 190 is very low and, thus, it is difficult for the source 190 to be vaporized. Accordingly, the source gas line 188 has a relatively large diameter to facilitate the vaporization. Further, the source gas line 188 has a length that is as short as possible, so that the pressure inside the second source tank 192 is set to be close to the pressure inside the processing chamber 132.

Inserted into the second source tank 192 is a bubbling gas line 198, a leading end of which is positioned around a bottom portion of the second source tank 192. In the bubbling gas line 198, a mass flow controller 200 and an on-off valve 202 are successively provided. Accordingly, a source 190 is preferably converted to a gas by introducing a bubbling gas into the first source tank 192 while controlling the flow rate thereof. Then, the source gas thus generated is supplied along with the bubbling gas.

In the present embodiment, a nonreactive gas, e.g., $N_2$ gas, is used as the bubbling gas. Alternatively, CO gas or a rare gas such as He gas, Ar gas or the like may be used instead of $N_2$ gas. Further, in the second source tank 192, a tank heating unit 204 for heating the source 190 is provided to accelerate the vaporization. In the present embodiment, as the source 190, a particulate solid, e.g., ruthenium carbonyl $(Ru_3(CO)_{12})$ containing Ru that is an element of the group VIII may be used.

In order to prevent the source gas from being re-condensed on the source gas line 188 and the on-off valve 194 provided therein, a tape heater, an aluminum block heater, a mantle heater, a silicon lever heater or the like, which are not shown, is wound on the source gas line 188 and the on-off value 194 to heat the units 188 and 194.

A purge gas supply unit (not shown) is connected to the shower head 134 to supply a purge gas as necessary. As the purge gas, a nonreactive gas such as $N_2$ gas, Ar gas, He gas, Ne gas or the like may be used.

In addition, the control unit 206 including, e.g., a computer or the like is provided to control general operations of the apparatus. Accordingly, the controls of the start or stop of the gas supply, the gas supply rate, the pressure inside the processing chamber 40, the temperature of the wafer W, and the like are performed. The control unit 206 includes the storage medium 208 for storing a computer program for performing the above controls.

In the present embodiment, to control the flow rate of the source gas, the storage medium 208 pre-stores as a reference data a relationship between the flow rates of the bubbling gas and the source gas and corresponding values measured by the pressure gauge 196. Accordingly, in the film-forming process, by adjusting the flow rate of the bubbling gas based on the measured values of the pressure gauge 196, the supply amount of the source gas is controlled. As the storage medium 208, e.g., a flexible disc, a flash memory, a hard disc, a compact disc or the like may be used. Further, the control unit 206 is operated under the control of the system control unit 34 (see FIG. 1).

Next, the operation of the third processing system 12C having such configuration described above will be described. First, the semiconductor wafer W is held and transferred by a transfer arm (not shown) and is loaded into the processing chamber 132 via the opened gate valve G and the loading/unloading port 142. The wafer W is transferred onto the upwardly moved upthrust pins 162 and then mounted and supported on the upper surface of the mounting table 156 as the upthrust pins 162 are moved downwardly.

Thereafter, the source gas supply system 184 is operated and a source gas is supplied to the shower head 134 at a controlled flow rate. Then, the source gas is introduced into the processing space S by being injected through the gas injection holes 136. Various modifications of such supply process of the source gas may be made as will be described later.

The atmospheres in the processing chamber 132 and the gas exhaust space 146 are evacuated to a vacuum level by continuously driving the vacuum pump 182 provided in the vacuum exhaust system 176. In addition, the atmosphere in the processing space S is maintained to a predetermined process pressure by adjusting the valve opening level of the pressure control valve 180. At this time, the wafer W is heated by the resistance heater 158 provided in the mounting table 156 to be maintained at a predetermined process temperature. Accordingly, a desired metal film, i.e., a Ru film in the present embodiment, is formed on the surface of the semiconductor wafer W.

(Description Related to Fifth Processing Apparatus 12E)

Figure 5:
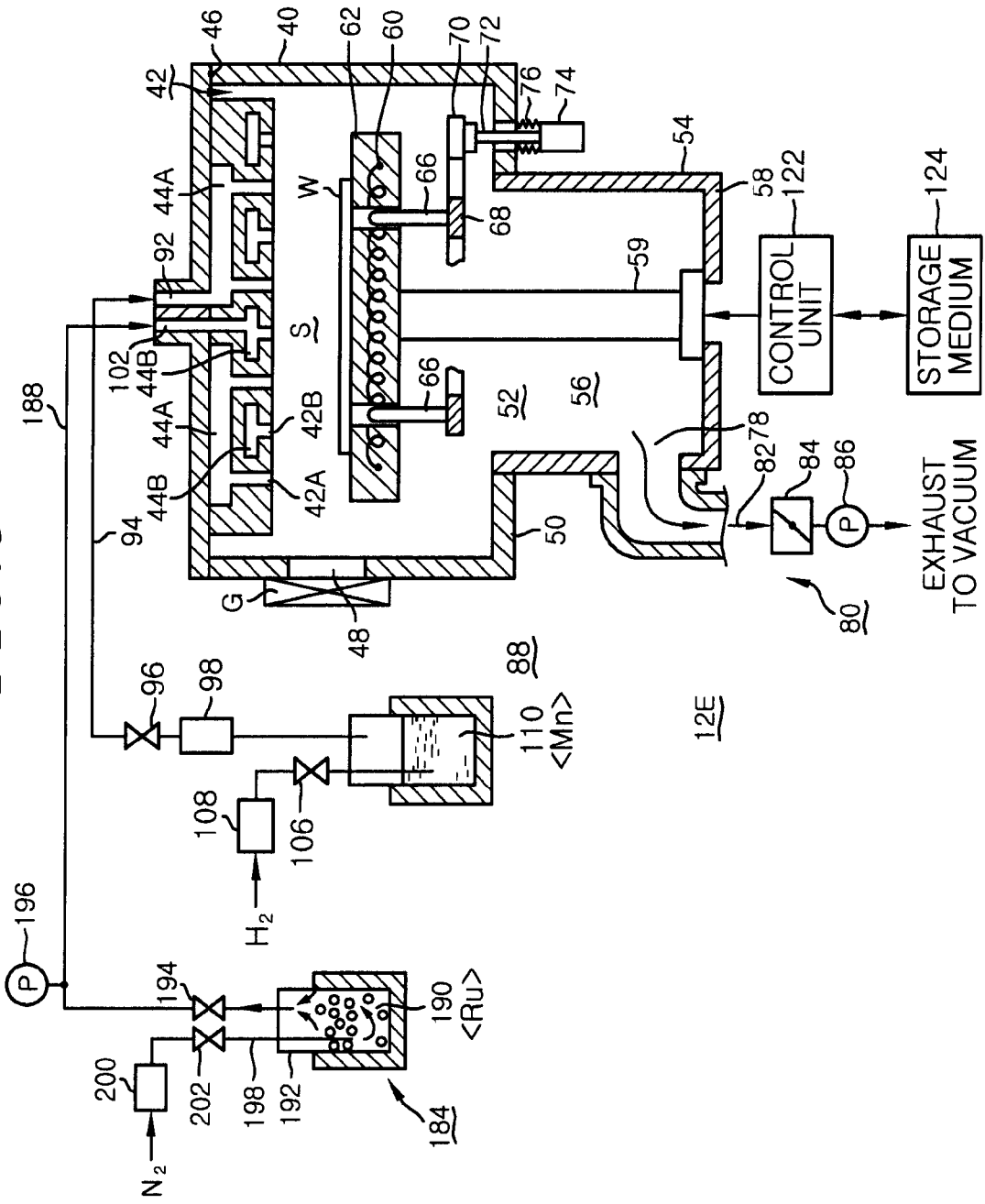
FIG. 5 shows an example of a fourth processing device.

Next, the fifth processing apparatus 12E (see FIG. 2) will be described. FIG. 5 is a configuration view showing an example of the fifth processing apparatus, where components having substantially the same configuration and function as those in FIG. 1 are denoted by like reference characters and, thus, redundant description thereof will be omitted herein. The fifth processing apparatus 12E is a single processing apparatus for forming both a $MnO_x$ film and a Ru film.

The fifth processing apparatus 12E includes a processing chamber 40 formed of aluminum, the inside of which has, e.g., an approximately cylindrical shape. Moreover, a shower head 42 is provided at a ceiling portion of the processing chamber 40, the shower head 42 serving as a gas introducing unit for introducing a necessary processing gas, e.g., a film-formation gas. A processing gas is injected to a processing space S through a plurality of gas injection holes 42A or 42B provided on a lower gas injection surface of the shower head 42.

Two hollow gas diffusion spaces 44A and 44B are provided in the shower head 42 such that processing gases introduced into the gas diffusion spaces 44A and 44B are respectively diffused in a plan direction and then respectively ejected through the gas injection holes 42A and 42B that communicate therewith. In other words, the gas injection holes 42A and 42B are arranged in a matrix form, and the gases respectively ejected through the gas injection holes 42A and 42B are mixed in the processing space S. Such gas supply method is referred to as "post-mix method."

The whole part of the shower head 42 is formed of, e.g., nickel, a nickel alloy such as Hastelloy (trademark), aluminum or an aluminum alloy. A sealing member 46 formed of, e.g., an O ring is provided at a connection portion between the shower head 42 and an upper opening of the processing chamber 40. The sealing member 46 serves to maintain the airtightness of the processing chamber 40.

Connected to the shower head 42 are source gas supply systems 88 and 184 for respectively supply a source gas containing a transition metal and a source gas of a metal film.

The source gas supply systems 88 and 184 respectively include source gas lines 94 and 188 connected to a gas inlet 92 of the gas diffusion chamber 44A and a gas inlet 102 of the gas diffusion chamber 44B.

A purge gas supply unit (not shown) is connected to the shower head 42 to supply a purge gas as necessary. As the purge gas, a nonreactive gas such as $N_2$ gas, Ar gas, He gas, Ne gas or the like may be used.

Although the source gas lines 94 and 188 of the source gas supply systems 88 and 184 are respectively connected to the gas inlets 92 and 102 in the present embodiment (post-mix method), the source gas lines may be connected to the shower head including a single gas diffusion chamber (pre-mix method) as shown in FIGS. 3 and 4.

In accordance with the fifth processing apparatus 12E, it is possible to form both a $MnO_x$ film and a Ru film with the single processing apparatus as described above. Further, as will be described later, it is possible to form a mixed layer of Mn and Ru by providing the source gas containing Mn and the source gas containing Ru together.

(Film-Forming Method of the Present Invention)

Figure 7:
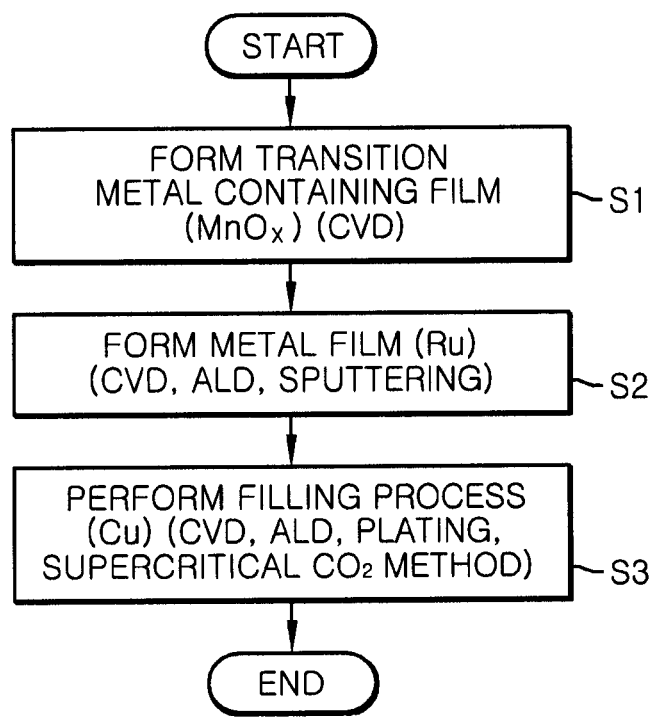
FIG. 7 is a flowchart showing a film-forming method of the present invention.
Figure 8:
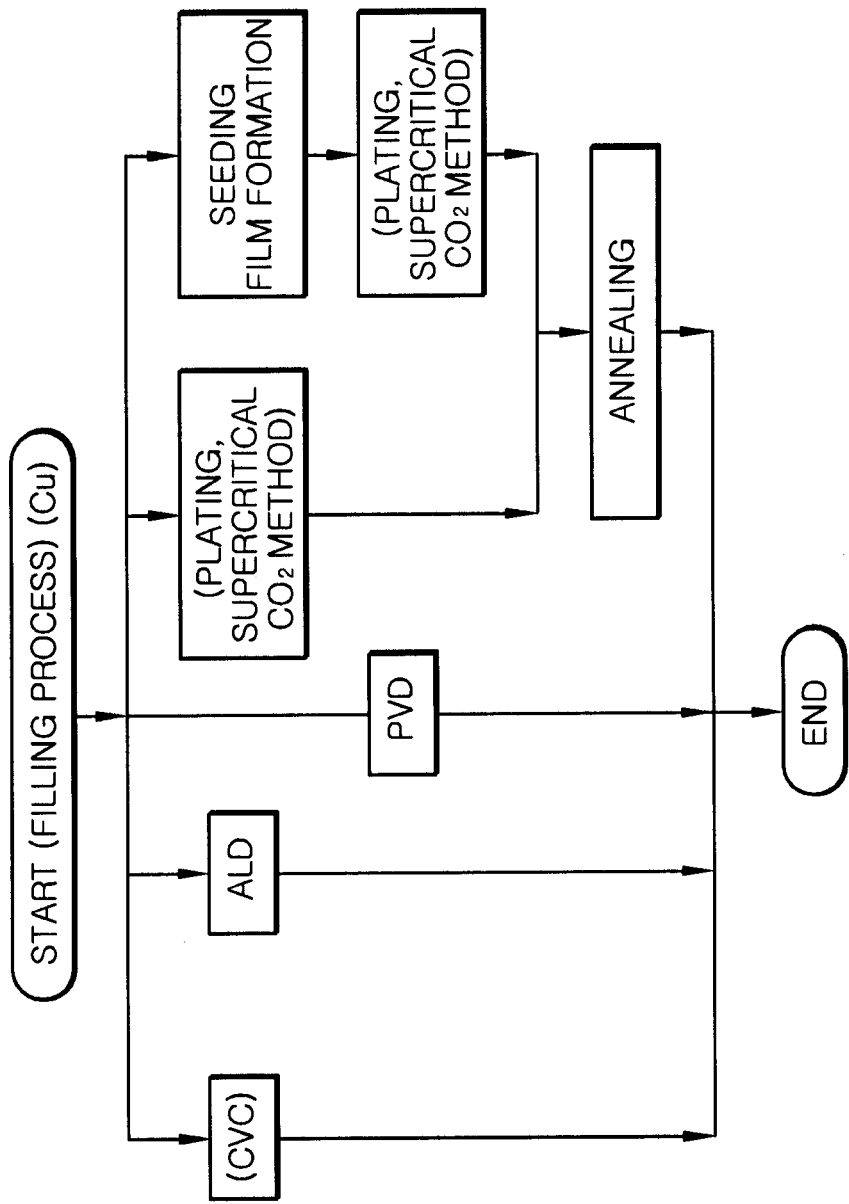
FIG. 8 is a view for explaining various shapes for a filling process.
Figure 9A:
FIGS. 9A to 9C are timing views showing a supply state of each gas when a metal film forming process is performed.
Figure 9B:
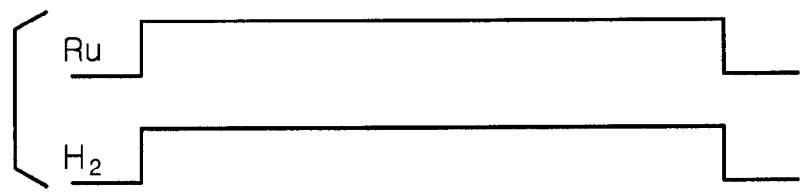
Figure 9C:
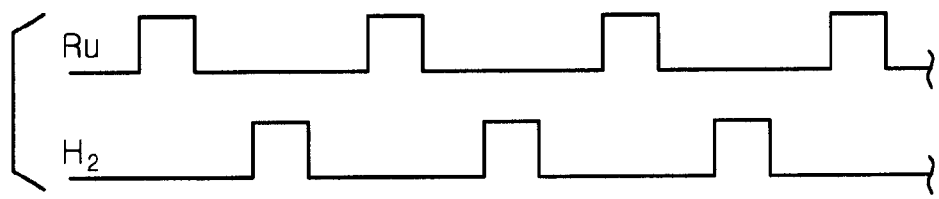
Figure 10:
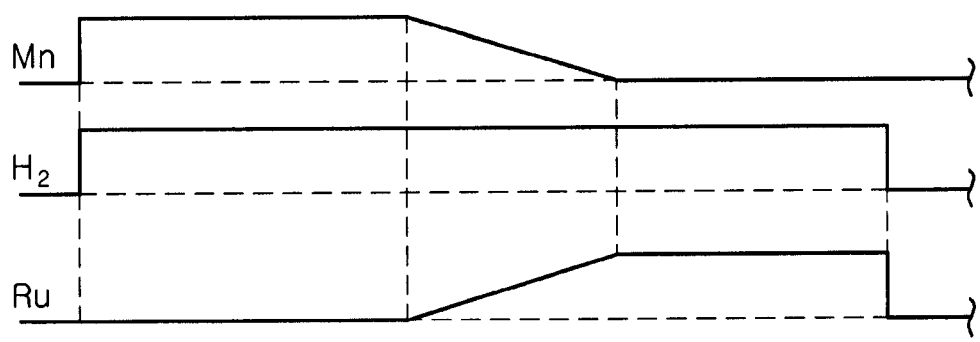
FIG. 10 is a timing view showing a supply state of each gas when a mixed film containing Mn and Ru is formed.
Figure 11:
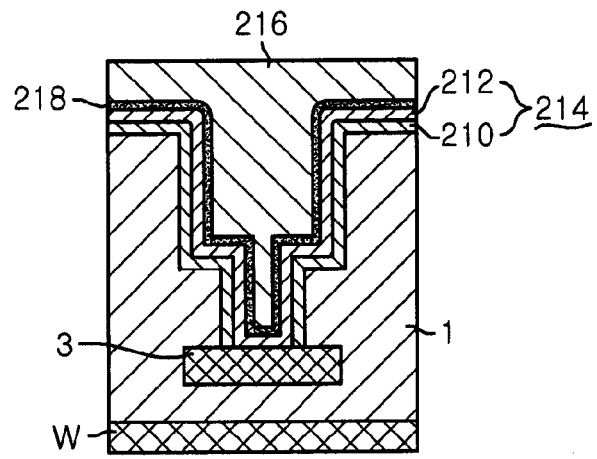
FIG. 11 is a cross-sectional view showing a final filled state of a recessed portion when a seeding film is formed.
Figure 12:
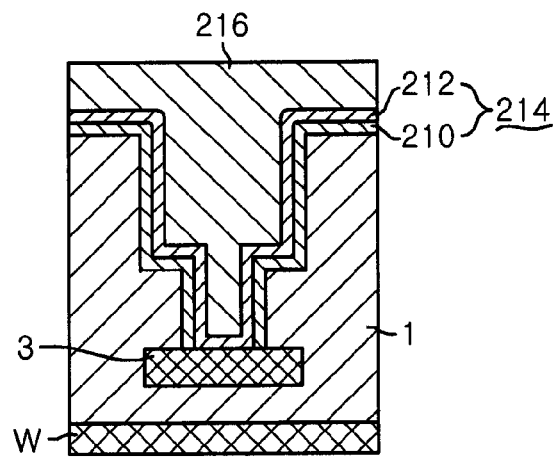
FIG. 12 is a cross-sectional view showing a state in which a filling material and a wiring layer are directly connected to each other in a bottom portion of a recessed portion of a semiconductor wafer.
Figure 13:
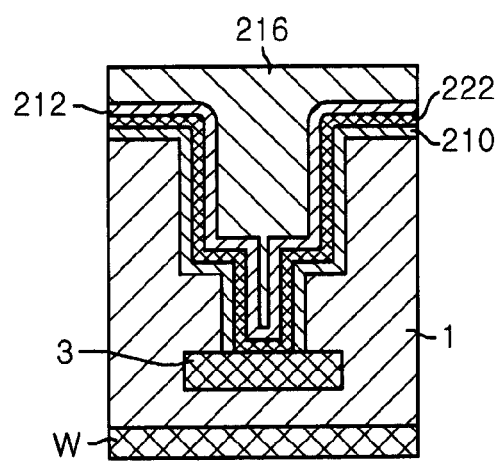
FIG. 13 is a cross-sectional view showing a final filled state of a recessed portion when a mixed film containing Mn and Ru is formed.

Next, an embodiment of a film-forming method of the present invention performed by using the processing system or the processing apparatus shown in FIGS. 1 to 5 will be described in detail. FIGS. 6A to 6D show examples of deposition states of a thin film on a recessed portion of a semiconductor wafer, and FIG. 7 is a basic flowchart showing a film-forming method of the present embodiment. FIG. 8 is a view for explaining various shapes for a filling process, and FIGS. 9A to 9C are timing views showing a supply state of each gas when a metal film forming process is performed. FIG. 10 is a timing view showing a supply state of each gas when a mixed film containing Mn and Ru is formed, and FIG. 11 is a cross-sectional view showing a final filled state of the recessed portion when a seeding film is formed. FIG. 12 is a cross-sectional view showing a state in which a filling material and a wiring layer are directly connected to each other in a bottom portion of the recessed portion of the semiconductor wafer, and FIG. 13 is a cross-sectional view showing a final filled state of the recessed portion when a mixed film containing Mn and Ru is formed.

One of the objects of the present invention is to provide a good barrier property against a Cu film and a good adhesivity to the Cu film by interposing a Ru film of the group VIII between the Cu film serving as a filling film of the recessed portion and a transition metal-containing film serving as a part of the barrier layer. In the present embodiment, the transition metal containing film is a Mn film, a $MnO_x$ film or the like that is formed by the second or the fifth processing apparatus 12B or 12E, and the Mn barrier film is a $MnO_x$ film, a $MnSi_xO_y$ film or the like that is formed at a boundary portion of the transition metal-containing film 210 and a base film (underlying insulation layer).

First, when the wafer W is loaded into the processing system 10 shown in FIG. 1 or 2, the recessed portion 2 such as a trench or a groove has been formed on the surface of the insulation layer 1, e.g., an interlayer dielectric film or the like, formed on the wafer W. At a bottom portion of the recessed portion 2, the lower wiring layer 3 formed of a copper or the like is formed to be exposed.

Specifically, the recessed portion 2 includes an elongated groove (trench) 2A having a concave section; and a hole 2B formed at a part of the bottom portion of the recessed portion 2. The hole 2B becomes a contact hole or a through hole. The wiring layer 3 is exposed at the bottom portion of the hole 2B to make an electric connection to a lower wiring layer (not shown), a transistor (not shown) and/or the like. The insulation layer serving as the base film is formed of oxide, nitride or the like containing silicon, for example, $SiO_2$.

In accordance with the present embodiment, a degas process or a cleaning process serving as a pre-treatment is first performed on the surface of the above-described semiconductor wafer W to clean the surface of the recessed portion 2. The cleaning process is performed by the first processing apparatus 12A (see FIG. 1). As described above, the cleaning process includes a $H_2$ plasma process, an Ar plasma process, a dry cleaning process using organic acid, a cleaning process using hot-wire atomic hydrogen and the like.

After such pre-treatment on the wafer W is completed, the wafer W is then subjected to a film-forming process. First, as shown in FIG. 6B, a transition metal-containing film forming process is performed on the surface of the wafer W that has been completely subjected to the pre-treatment to form a transition metal-containing film 210 thereon (S1 of FIG. 7). This process is performed in the second or the fifth processing apparatus 12B or 12E. Accordingly, the transition metal-containing film 210 is formed on the entire surface of the wafer W including the surface of the recessed portion 2 except for the bottom portion of the recessed portion 2. In the present embodiment, the transition metal-containing film 210 is mainly formed of the MnOx film or the Mn film, and the $MnO_x$ film or the $MnSi_xO_y$ film (x and y being integers) serving as the Mn barrier film is formed at the boundary portion of the transition metal-containing film 210 and the insulation layer 1.

It is preferable to use the chemical vapor deposition (CVD) to form the transition metal-containing film 210. Alternatively, the atomic layered deposition (ALD) may be used. The ALD indicates a film-forming method of repeatedly forming and depositing an atomic or molecular level thin film one by one by alternately supplying different film-formation gases.

After the transition metal-containing film forming process is completed, a metal film forming process (S2 of FIG. 7) is then performed as shown in FIG. 6C to form, on the surface of the wafer W, a metal film 212 containing an element of the group VIII of the periodic table. This process is performed in the third or the fifth processing apparatus 12C or 12E. Accordingly, the metal film 212 is formed on the entire surface of the wafer W including the surface of the recessed portion 2, and a barrier layer 214 including the transition metal-containing film 210 and the metal film 212 is formed.

The metal film 212 is formed of, e.g., a Ru film in the present embodiment. Further, the CVD, the ALD or the sputtering method may be used to form the metal film 212. In the case of using the sputtering method, a sputtering film-forming apparatus for performing the sputtering of Ru is used as the third processing apparatus 12C.

After the metal film forming process is completed, a filling process is then performed as shown in FIG. 6D to fill the recessed portion 2 with a filling metal 216 (S3 of FIG. 7). This filling process is performed in the fourth processing apparatus 12D. Accordingly, the recessed portion 2 is completely filled, and the filling metal 216 is formed on the entire surface of the wafer W. In the present embodiment, copper (a Cu film) is used as the filling metal 216.

Any of the CVD, the ALD, the PVD (sputtering) method, the supercritical $CO_2$ method, and the plating method may be used to form the filling metal 216. In the case of performing the filling process by the plating method or the supercritical $CO_2$ method, a Cu seeding film may be deposited by the fourth processing apparatus 12D, and the filling process may be performed by a processing apparatus provided outside the processing system 10.

In addition, the Ru film serving as the metal film 212 also serves as a seeding film for copper. Accordingly, in the case of performing the Cu plating or the supercritical Cu film-formation, the copper may be deposited on the Ru film without forming the Cu seeding film. Alternatively, to reliably perform the copper deposition, as in the conventional method, the Cu plating or the supercritical Cu film-formation may be performed after the Cu seeding film is formed on the Ru film. In this case, in the cross-sectional structure, a seeding film 218 is interposed between the Ru film serving as the metal film 212 and the filling metal 216 formed of copper as shown in FIG. 11. In this way, the film-forming process is completed. Thereafter, the redundant part of the filling metal 216 and the like on the surface of the wafer W is removed by the CMP process.

As such, in the film-forming method for forming a thin film on the surface of a target substrate, e.g., the semiconductor wafer W, by performing the transition metal-containing film forming process which forms the transition metal-containing film 210 by the heat treatment using the transition metal-containing source gas and the metal film forming process which forms the metal film 212 containing an element of the group VIII of the periodic table to form the stacked structure of the transition metal-containing film 210 and the metal film 212, it is possible to realize the excellent barrier property and adhesivity with regard to, e.g., the Cu film to be formed on a stacked structure of the transition metal-containing film 210 and the metal film 212.

Hereinafter, each of the above processes will be described in detail. First, it is preferable to employ the CVD to perform the transition metal-containing film forming process S1 for forming the transition metal-containing film 210 (the Mn containing film such as the $MnO_x$ film, the Mn film or the like) by using the second processing apparatus 12B.

Specifically, a Mn containing source gas is bubbled to be supplied by using $H_2$ gas serving as a reducing gas, and a Mn-containing film is formed by the thermal CVD. In this case, the Mn-containing source gas is reacted with an oxygen component and/or a moisture on or around the surface of the $SiO_2$ film serving as the base (underlying) insulation film; or the oxygen of the $SiO_2$, so that the $MnO_x$ film is formed.

In this case, however, the wiring layer 3 formed of copper is exposed at a bottom portion of the hole 2B of the recessed portion 2, and copper oxide is removed from the exposed surface thereof by the pre-treatment. For that reason, the Mn film is hardly deposited due to the selective deposition of CVD-$MnO_x$. Furthermore, even when Mn atoms are separated from the Mn-containing source gas, no $MnO_x$ film is formed since the Mn is solid-solute and diffused in the Cu. Accordingly, in the bottom portion of the hole 2B, the Cu film serving as the filling metal 216 is brought into contact with the Cu of the wiring layer 3 directly or via the Ru metal film. Therefore, the metals are in contact with each other at the contact portion, where the $MnO_x$ film having a relatively large electric resistance is not formed and thus, the contact resistance is reduced by such extent.

FIG. 12 shows the cross-sectional shape of the recessed portion 2 in the above case. In the bottom portion of the hole 2B of the recessed portion 2, the wiring layer 3 and the Ru film serving as the metal film 212 are directly brought into contact with each other with a good contact state. At this time, as for the process conditions, the process temperature (wafer temperature) and the process pressure are respectively set to range from about 70 to 450° C. and about 1 Pa to 13 kPa. Further, the flow rate of the Mn-containing source gas is not limited specifically, but set to range from about 0.1 to 10 sccm in consideration of the film-formation speed or the like.

Next, as described with the step S2 of FIG. 7, there are three methods of the CVD, the ALD and the sputtering method used to perform the metal film forming process S2 to form the metal film 212 (Ru film). The CVD is used in the case of FIG. 9A or 9B. In the case of FIG. 9A, the film-forming method is performed by using the third film-forming apparatus 12C shown in FIG. 4 or the fifth film-forming apparatus 12E shown in FIG. 5.

In accordance with the film-forming method in the case of FIG. 9A, a Ru-containing source gas that is produced by vaporizing the source 190 formed of ruthenium carbonyl is supplied along with a bubbling gas and is then thermally decomposed to form the metal film 212 of the Ru film. At this time, as for the process conditions, the process pressure and the process temperature are respectively set to range from 0.1 mTorr to 200 mTorr, preferably from 2 mTorr to 50 mTorr and from 50° C. to 500° C., preferably from 50° C. to 350° C.

As described above, the control of the flow rate is performed by adjusting the flow rate of the bubbling gas based on the measured value of the pressure gauge 196. For example, the flow rate of the bubbling gas is set to range from 0.1 to 1000 sccm.

In the CVD shown in FIG. 9B, $H_2$ gas serving as the reducing gas is employed. The CVD using $H_2$ gas is performed by using a $H_2$ gas supply system additionally connected to the shower head 134 in the third processing apparatus 12C.

In this case, the Ru-containing source gas and the $H_2$ gas are supplied together and, thus, the decomposition or the reduction is accelerated by the $H_2$ gas to form the metal film 212 of the Ru film. In this regard, it is possible to obtain an effect in which the material characteristics of the Ru film are improved because the reducing gas is supplied. For example, the electric resistance of the Ru film is reduced. At this time, the process conditions such as the process pressure, the process temperature and the like are the same as the case of FIG. 9A.

In accordance with the ALD in the case of FIG. 9C, the same processing apparatus as that in FIG. 9B is used, and the Ru-containing source gas and the $H_2$ gas serving as the reducing gas are alternately intermittently supplied. Then, an atomic or molecular level thin film is stacked to thereby form the metal film 212 of the Ru film.

At this time, the process conditions such as the process pressure, the process temperature and the like are the same as the case of FIG. 9A. As the reducing gas, CO, a silicon-containing gas, a boron-containing gas, a nitrogen-containing gas or the like may be used without the limitation to the $H_2$ gas. The silicon-containing gas includes, e.g., $SiH_4$, $Si_2H_5$, $SiCl_2H_2$ and the like, and the boron-containing gas includes, e.g., $BH_3$, $B_2H_5$, $B_3H_9$ and the like. The nitrogen-containing gas includes, e.g., $NH_3$.

In accordance with the sputtering method, a sputtering film-forming apparatus is used as the third processing apparatus 12C, and the sputtering of the Ru is performed to thereby form the Ru film on the surface of the wafer W.

Next, as shown in FIG. 8, the filling process for performing the filling of the recessed portion 2 includes the CVD, the ALD, the PVD (sputtering) method, the supercritical $CO_2$ method, and the plating method. In the case of using the plating method or the supercritical $CO_2$ method, a seeding film may be formed of a conductive metal such as Cu or the like before the filling process is performed. Further, it is preferable to perform an annealing process after the filling process.

In the case of the CVD, a Cu-containing source gas and $H_2$ gas serving as the reducing gas are supplied together, and a Cu film is formed by the CVD to thereby perform the filling of the recessed portion 2. In the case of the ALD, the Cu-containing source gas and the $H_2$ gas are supplied alternately repeatedly as described in FIG. 9C, for example. Alternatively, no $H_2$ gas may be supplied, and the Cu-containing source gas may be intermittently supplied. Then, the Cu film of Cu may be formed by only a thermal decomposition reaction.

In these cases (including the case of the CVD), as for the process conditions, the process temperature (wafer temperature) and the process pressure are respectively set to range from about 70 to 350° C. and from about 1 Pa to 13 kPa. The flow rates of the Cu-containing source gas and the $H_2$ gas are respectively set to range from about 0.1 to 100 sccm and from 5 to 500 sccm.

In the case of the CVD or the ALD, it is easy for a thin film to be deposited in an inner wall of a minute recessed portion as compared with the plating method. Accordingly, even when the size of a recessed portion becomes minuter, it is possible to perform the filling of the recessed portion without generating any void therein. Further, in the case of performing the annealing process, the wafer W that has been subjected to the filling process is heated to a predetermined process temperature ranging, e.g., from about 100 to 450° C. in the atmosphere of an oxygen-containing gas with a predetermined concentration. Accordingly, it is possible to reliably form a Mn barrier film ($MnO_x$ film, $MnSi_xO_y$ film or the like) improving the barrier property by self-alignment at a boundary portion of the Mn-containing film and the insulation layer 1 formed of the $SiO_2$ film serving as the base (underlying) film.

The annealing process is performed to reliably form the Mn barrier film. Accordingly, if the preceding processes of the annealing process are performed at a temperature that is enough for the self-formation of the Mn barrier film, e.g., a high process temperature of 100 to 150° C. or higher, the Mn barrier film has been formed to have a sufficient thickness. For that reason, the annealing process may become unnecessary. Here, as the Cu-containing source gas, Cu(I)hfac TMVS (Copper complex), $Cu(hfac)_2$, $Cu(dibm)_2$ or the like may be used (see, e.g., Japanese Patent Application Publication No. 2001-053030).

As such, in the film-forming method for forming a thin film on the surface of a target substrate to be processed, by performing the transition metal-containing film forming process which forms the transition metal-containing film 210 by the heat treatment using the transition metal-containing source gas and the metal film forming process which forms the metal film 212 containing an element of the group VIII of the periodic table to form a stacked structure of the transition metal-containing film 210 and the metal film 212, it is possible to realize the excellent barrier property and adhesivity with regard to, e.g., a Cu film to be formed on the stacked structure of the transition metal-containing film 210 and the metal film 212.

Further, it is possible to perform most of the aforementioned series of processes in the same processing system, that is, successively in-situ without exposure to the atmosphere, resulting in an increased throughput and improvement of the film quality and the adhesivity. Besides, although the case using the Ru as an element of the group VIII is taken as an example in the above embodiments, it is possible to use another one of the group VIII, e.g., one selected from the group consisting of Fe, Co, Ni, Rh, Pd, Os, Ir and Pt or an alloy thereof.

Actually, an evaluation test was performed on the adhesivity between the copper film and the elements of the group VIII, and a satisfactory result was obtained. In the evaluation test, a metal film of each element was formed by using the sputtering method or the vapor deposition method, and a Cu film was formed thereon. Then, the Cu film was peeled off by a tape test. As a result, insufficient adhesivity was obtained for the metal films of metals such as Ti, Ta, Ag, and Au other than those of the group VIII. The high adhesivity was obtained for the metal films of Ru, Co, Ni, Rh, Pd, Ir and Pt of the group VIII, showing the effectiveness of the present invention.

In addition, although the case where the Mn-containing film and the Ru film provided thereon are clearly separated is taken as an example in the above embodiment, a mixed layer of Mn and Ru may be formed at a boundary therebetween. The mixed layer may be formed by using the fifth processing apparatus 12E shown in FIG. 5. Specifically, as shown in FIG. 10, the Mn-containing source gas is supplied at a defined amount to form the Mn film ($MnO_x$ film). In midstream, i.e., at the transition from the transition metal-containing film forming process to the metal film forming process, the Ru film is formed by gradually increasing a supply amount of the Ru-containing source gas while gradually decreasing a supply amount of the Mn-containing source gas to zero flow rate and, resultantly, by supplying the Ru-containing source gas only at a defined amount.

In this case, as shown in FIG. 13, a mixed layer 222 of Mn and Ru is formed between the Mn-containing film 210 and the metal film 212 of Ru. Accordingly, it is possible to improve further the adhesivity between the Mn-containing film 210 and the Ru film 212.

Moreover, although the film-forming method using the thermal CVD and the thermal ALD is taken as an example in the above embodiment, plasma CVD, plasma ALD, photonic CVD using ultraviolet rays or laser beams, photonic ALD or the like may be used without the limitation to the embodiment presented above.

In the meantime, an organic metal material using the Mn-containing source includes at least one material selected from the group consisting of $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i\text{-}PrCp)_2Mn[=Mn(C_3H_7C_5H_4)_2]$, $MeCpMn(CO)_3[=(CH_3C_5H_4)Mn(CO)_3]$, $(t\text{-}BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, and $((CH_3)_5Cp)_2Mn[=Mn((CH_3)_5C_5H_4)_2]$. Further, other than the organic metal material, a metal complex material may be used.

Although the case of using the $SiO_2$ film as the base (underlying) insulation layer 1 is taken as an example in the above embodiment, a SiCOH film or a SiOC film serving as a material of low-k (low relative dielectric constant) used as an interlayer dielectric layer containing oxygen and carbon may be used without the limitation to the case of using the $SiO_2$ film. Specifically, as the base film, one selected from the group consisting of a $SiO_2$ film (including a thermal oxide film and a TEOS film), a SiOF film, a SiC film, a SiN film, a SiOC film, a SiCOH film, a SiCN film, a porous silica film, a porous methylsilsesquioxane film, a polyarylene film, a SiLK (trademark) film and a fluorocarbon film or a stacked layer thereof may be used. The oxygen and the carbon in the interlayer dielectric layer form a Mn oxide or a Mn carbide at a boundary with the Mn film, for example, which serves as a barrier.

Further, although the case using Mn as the transition metal is taken as an example, another transition metal such as at least one element selected from the group consisting of Nb, Zr, Cr, V, Y, Pb, Ni, Pt, Rh, Tc, Al, Mg, Sn, Ge, Ti and Re without the limitation to Mn may be used.

In the above embodiment, each processing apparatus is merely an example. For example, a heating lamp such as a halogen lamp or the like may be used as a heating unit, and a single-wafer heat treating apparatus or a batch type heat treating apparatus may be used.

The film-formation is not limited to the heat treatment method. For example, the shower head 42 or 134 and the mounting table 60 or 156 respectively may serve as an upper electrode and a lower electrode and a plasma may be generated by applying an RF power therebetween, to thereby allow the plasma to assist in the film-formation.

Further, in the above embodiment, a semiconductor wafer is used as the target substrate to be processed. A glass substrate, an LCD substrate, a ceramic substrate or the like may be used without the limitation thereto.

Besides, in accordance with the formation of the transition metal-containing film by the CVD, even when various sized trenches or holes are formed on the semiconductor wafer, sufficiently thin and uniform self-aligned barrier film may be formed on the entire part of the recessed portion. For that reason, it is possible to apply the techniques of the present invention to a lower local wiring and an upper global wiring in the Cu multilayer wiring. That is, the Cu multilayer wiring may be scaled down. Accordingly, it is possible to realize the high speed and the scaling-down of the semiconductor device. Therefore, it is possible to manufacture a compact high-speed electronic apparatus with high reliability.

What is claimed is:

1. A film-forming method for performing a film-forming process on a surface of a target substrate to be processed in an evacuable processing chamber, a recessed portion being formed on the surface of the target substrate, the method comprising:
    a transition metal-containing film forming process in which a transition metal-containing film is formed by a heat treatment by using a source gas containing a transition metal; and
    a metal film forming process in which a metal film containing an element of the group VIII of the periodic table is formed,
    wherein the transition metal containing film forming process and the metal film forming process are successively performed in a same processing chamber, and
    a mixed layer containing the transition metal and the element of the group VIII is formed by gradually increasing a supply amount of a VIII-group source gas including the element of the group VIII while gradually reducing a supply amount of the transition metal-containing source gas during a transition from the transition metal containing film forming process to the metal film forming process.

2. The method of claim 1, wherein the heat treatment is a chemical vapor deposition (CVD).

3. The method of claim 2, wherein the heat treatment is a thermal CVD using the source gas and a reducing gas.

4. The method of claim 1, wherein a heat treatment is performed in the metal film forming process.

5. The method of claim 4, wherein the heat treatment in the metal film forming process is a CVD.

6. The method of claim 4, wherein a plasma is also used in each of the heat treatments.

7. The method of claim 1, wherein the metal film is formed by a sputtering method in the metal film forming process.

8. The method of claim 1, further comprising: a filling process in which the recessed portion is filled by depositing a copper film after the metal film forming process.

9. The method of claim 8, wherein the filling process is performed by a CVD.

10. The method of claim 8, wherein the filling process is performed by a plating method.

11. The method of claim 8, wherein the filling process is performed by a sputtering method.

12. The method of claim 8, further comprising: an annealing process in which the target substrate is annealed after the filling process.

13. The method of claim 1, wherein a base film of the transition metal-containing film is formed of at least one film selected from a group consisting of a $SiO_2$ film, a SiOF film, a SiC film, a SiN film, a SiOC film, a SiCOH film, a SiCN film, a porous silica film, a porous methylsilsesquioxane film, a polyarylene film, a SiLK (trademark) film and a fluorocarbon film.

14. The method of claim 1, wherein a wiring layer is formed at a lower portion of the recessed portion.

15. The method of claim 1, wherein the transition metal containing source gas includes an organic metal material gas or a metal complex material gas.

16. The method of claim 15, wherein the transition metal includes manganese (Mn), and
    an organic metal material includes at least one material selected from a group consisting of $Cp_2Mn$ $[=Mn(C_5H_5)_2]$, $(MeCp)_2Mn[=Mn(CH_3C_5H_4)_2]$, $(EtCp)_2Mn$ $[=Mn(C_2H_5C_5H_4)_2]$, $(i\text{-}PrCp)_2Mn[=Mn(C_3H_7C_5H_4)_2]$, $MeCpMn(CO)_3[=(CH_3C_5H_4)Mn(CO)_3]$, $(t\text{-}BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)$ $[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3$ $[=Mn(C_5H_7O_2)_3]$, $Mn(hfac)_2 [=Mn(C_5HF_6O_2)_3]$, and $((CH_3)sCp)_2Mn[=Mn ((CH_3)_5C_5H_4)_2]$.

17. The method of claim 1, wherein the element of the group VIII includes at least one element selected from a group consisting of Fe, Co, Ni, Ru, Rh, Pd, Os, Ir and Pt.

18. A computer-readable non-transitory storage medium storing a computer-readable program to perform the film-forming method of any one of claims 1 to 5 and 7 to 17.

19. A semiconductor device having a film structure formed by the film-forming method of any one of claims 1 to 5 and 7 to 17.

20. An electronic apparatus having a film structure formed by the film-forming method of any one of claims 1 to 5 and 7 to 17.

* * * * *